(12) United States Patent
Hitachi et al.

(10) Patent No.: US 10,014,428 B2
(45) Date of Patent: Jul. 3, 2018

(54) SOLAR CELL MODULE AND SOLAR CELL MODULE MANUFACTURING METHOD

(71) Applicant: Panasonic Intellectual Property Management Co., Ltd., Osaka (JP)

(72) Inventors: Naohiro Hitachi, Osaka (JP); Tomohiro Funatani, Shiga (JP); Satoshi Tohoda, Osaka (JP); Shigeharu Taira, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 7 days.

(21) Appl. No.: 15/204,814

(22) Filed: Jul. 7, 2016

(65) Prior Publication Data

US 2016/0343897 A1     Nov. 24, 2016

Related U.S. Application Data

(63) Continuation of application No. PCT/JP2015/000514, filed on Feb. 5, 2015.

(30) Foreign Application Priority Data

Feb. 6, 2014   (JP) ................................. 2014-021324

(51) Int. Cl.
*H01L 31/18* (2006.01)
*H01L 31/054* (2014.01)
(Continued)

(52) U.S. Cl.
CPC ...... *H01L 31/0543* (2014.12); *H01L 31/0201* (2013.01); *H01L 31/0504* (2013.01);
(Continued)

(58) Field of Classification Search
CPC ............. H01L 31/0543; H01L 31/0508; H01L 31/0201
See application file for complete search history.

(56) References Cited

U.S. PATENT DOCUMENTS

| 4,321,417 A | 3/1982 | Kurth et al. |
| 2010/0147363 A1* | 6/2010 | Huang ............ B32B 17/10009 |
| | | 136/251 |
| 2013/0125952 A1 | 5/2013 | Sumitomo |

FOREIGN PATENT DOCUMENTS

| JP | S55-9500 A | 1/1980 |
| JP | 10-051022 A | 2/1998 |

(Continued)

OTHER PUBLICATIONS

International Search Report dated Mar. 10, 2015, issued in International Application No. PCT/JP2015/000514. (w/English translation).

*Primary Examiner* — Tae-Sik Kang
(74) *Attorney, Agent, or Firm* — McDermott Will & Emery LLP

(57) ABSTRACT

A solar cell module is provided with: a plurality of solar cell elements each having a surface; a light diffusion portion provided in an outer peripheral area of the surface; and connection members which connect the plurality of solar cell elements. The outer peripheral area has restricted areas where formation of the light diffusion portion is restricted, in a part thereof, and the restricted areas are provided in positions where the outer peripheral area and the connection members intersect. The solar cell element may have, on the surface, bus bar electrodes which extend along the connection members. The restricted areas may be provided in the vicinity of ends of the bus bar electrodes.

7 Claims, 13 Drawing Sheets

(51) Int. Cl.
*H01L 31/05* (2014.01)
*H01L 31/02* (2006.01)

(52) U.S. Cl.
CPC ........ *H01L 31/054* (2014.12); *H01L 31/0508* (2013.01); *H01L 31/0547* (2014.12); *H01L 31/18* (2013.01); *Y02E 10/52* (2013.01)

(56) References Cited

FOREIGN PATENT DOCUMENTS

| | | |
|---|---|---|
| JP | 2005-019901 A | 1/2005 |
| JP | 2005-243972 A | 9/2005 |
| JP | 2012-009681 A | 1/2012 |
| JP | 2012-119365 A | 6/2012 |
| WO | 2010/021204 A1 | 2/2010 |

\* cited by examiner

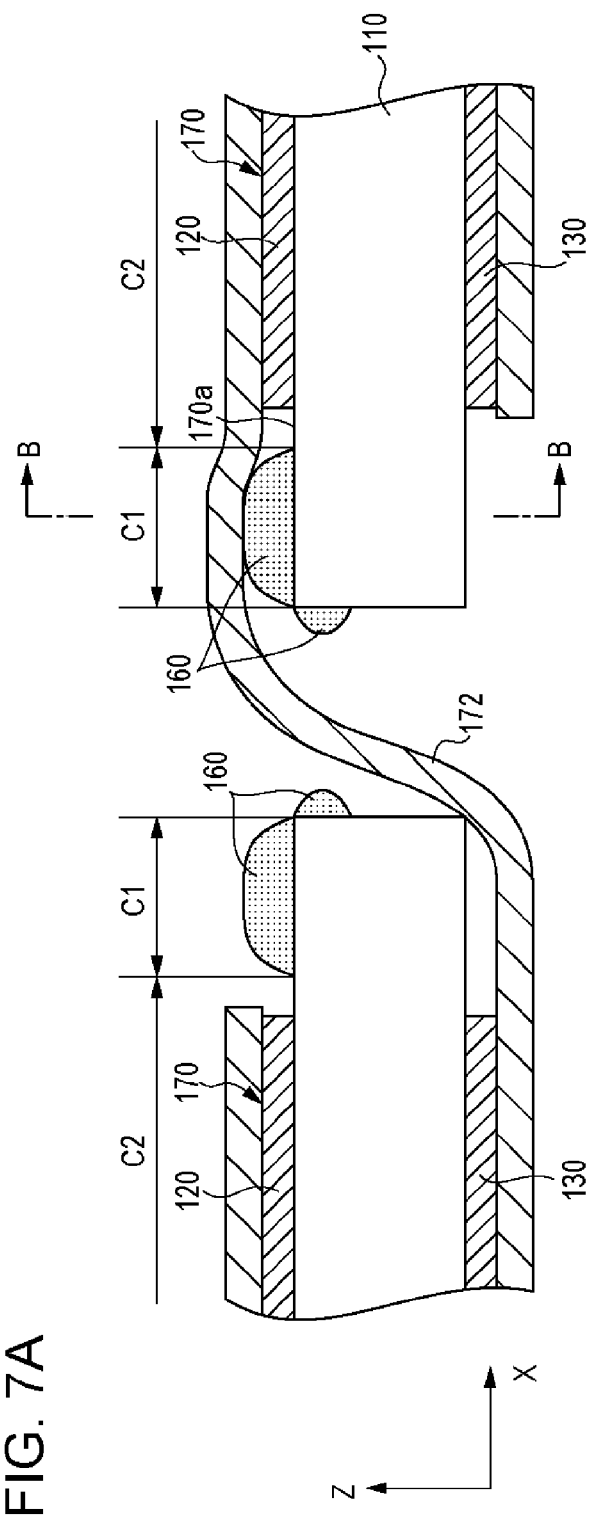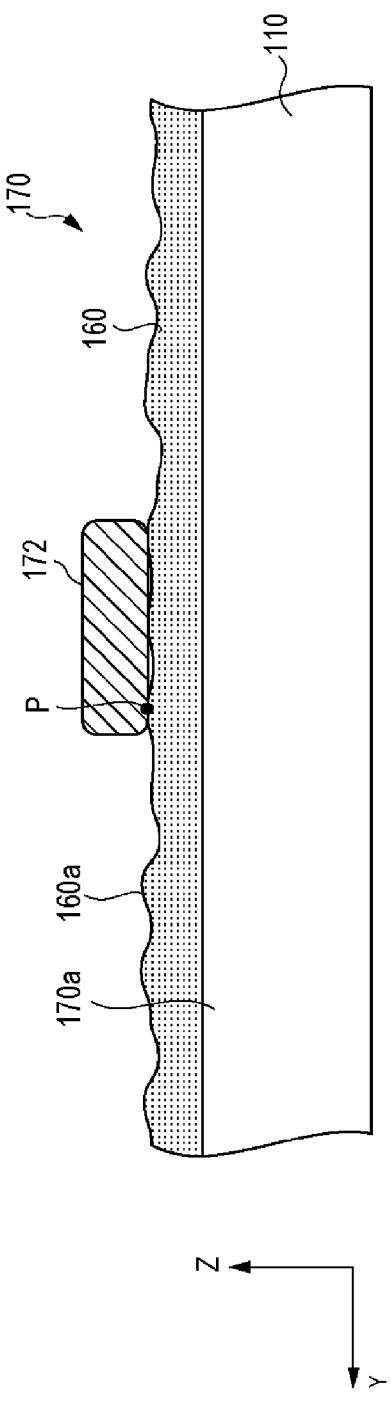

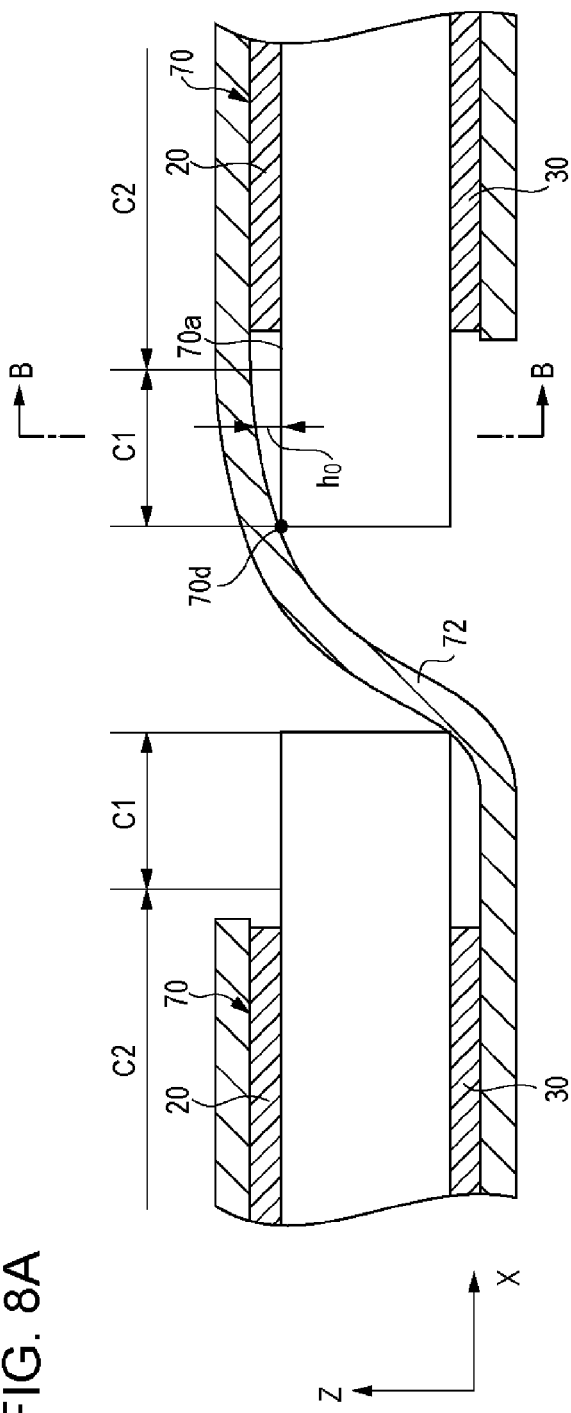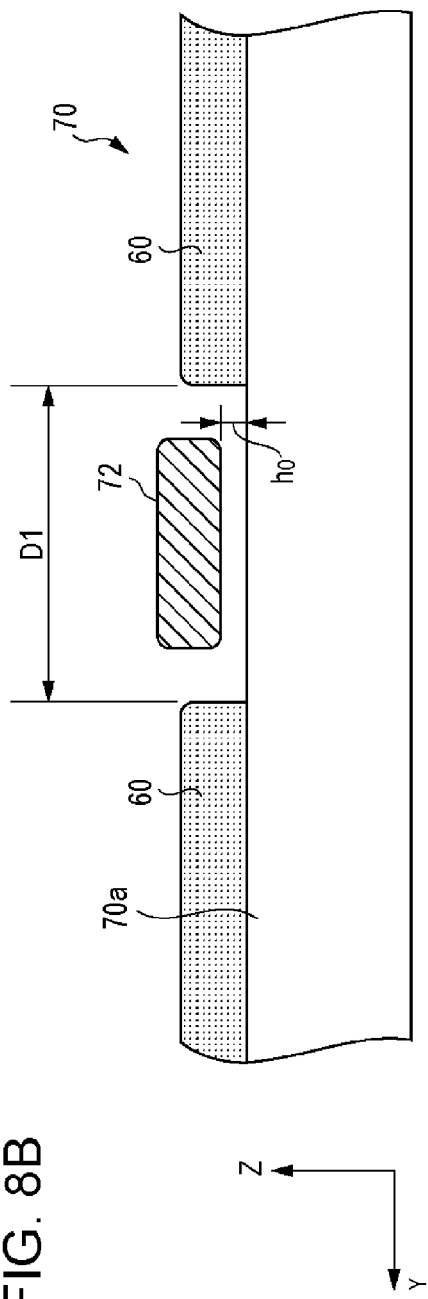
FIG. 8A
FIG. 8B

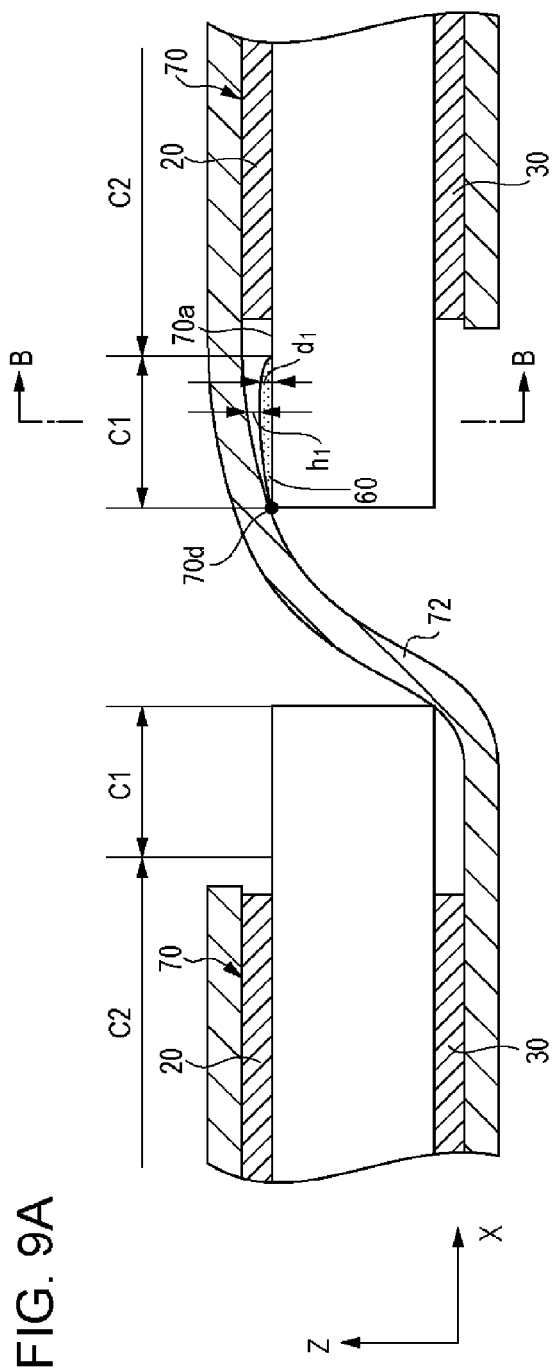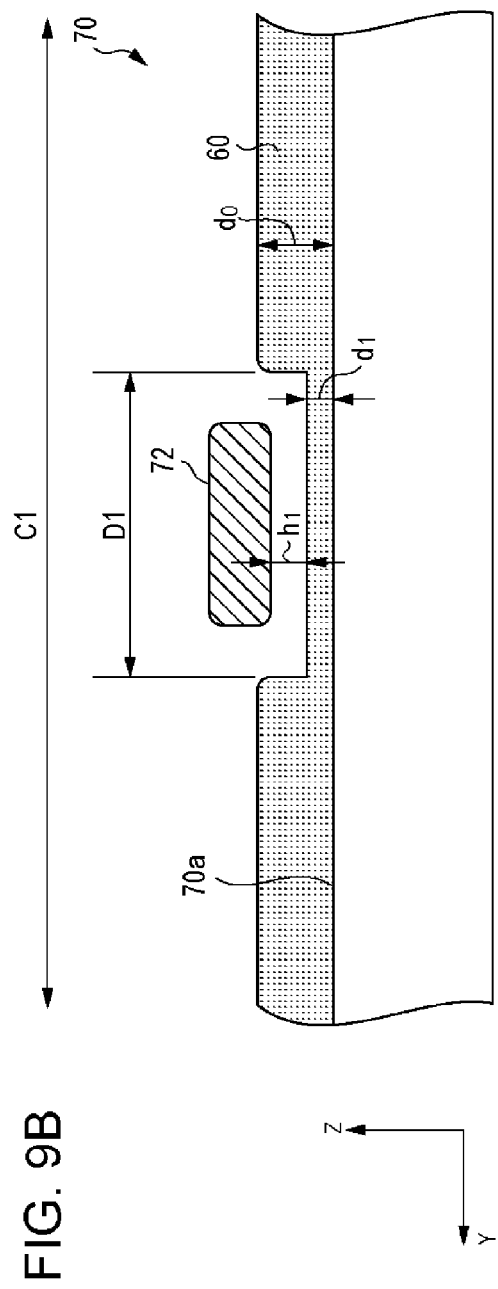
FIG. 9A
FIG. 9B

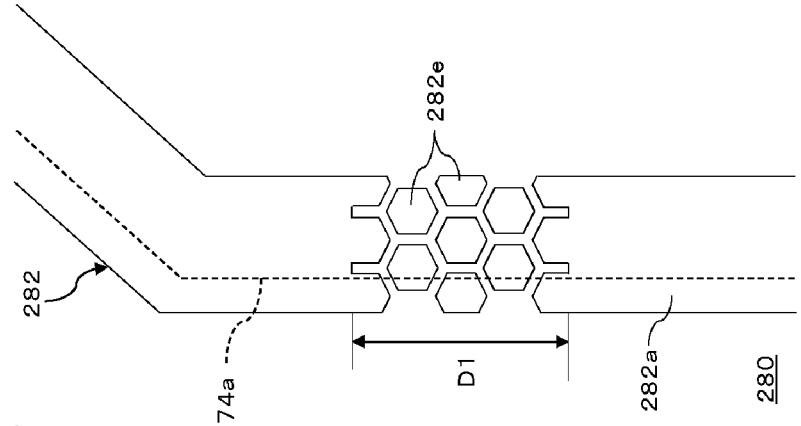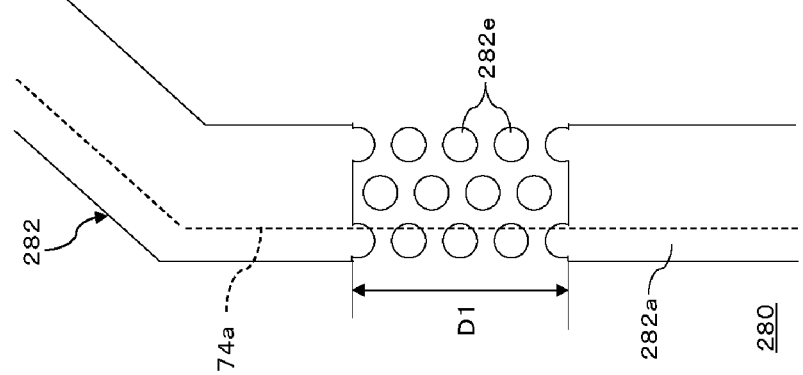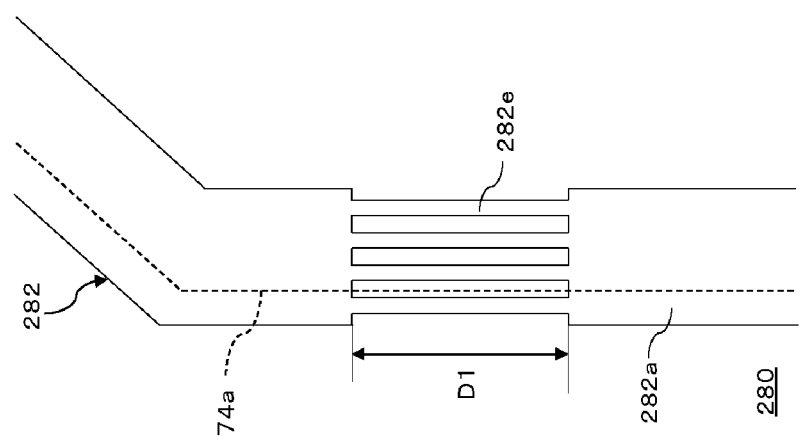

SOLAR CELL MODULE AND SOLAR CELL MODULE MANUFACTURING METHOD

RELATED APPLICATION

This application is a Continuation of International Application No. PCT/JP2015/000514, filed on Feb. 5, 2015, which in turn claims priority to Japanese Patent Application No. 2014-021324, filed on Feb. 6, 2014, the entire contents of which are incorporated herein by reference.

BACKGROUND

1. Field of the Invention

The present invention relates to solar cell modules and solar cell module manufacturing methods.

2. Description of the Related Art

A light-receiving surface of a solar cell, which is a light-incident surface, can be provided with an invalid area (an area where the generating capacity is low) that is unlikely to contribute the generation of electricity even when light is incident on an area located in its outer periphery, due to manufacturing processes. In the solar cell in which such an invalid area is provided, a structure has been proposed where a light diffusion portion is provided in the invalid area for effectively utilizing the incident light by diffusing the light incident on the invalid area.

SUMMARY

In recent years, a desire to further enhance the electricity generation efficiency of a solar cell module has been mentioned.

The present invention has been made in view of such circumstances, and an object thereof is to provide a technique for improving the electricity generation efficiency of the solar cell module.

In order to solve the above problems, one aspect of the present invention is a solar cell module. The solar cell module includes a plurality of solar cell elements each having a surface, and the light diffusion portion provided in an outer peripheral area of the surface, a connection member for connecting the plurality of solar cell elements. The outer peripheral area has a restricted area where the formation of the light diffusion portion is restricted in a part of the outer peripheral area. The restricted area is provided at an intersection of the outer peripheral area and the connection member.

Another aspect of the present invention is a solar cell module manufacturing method. The method includes: preparing a plurality of solar cell elements each having a surface, a coating having light diffusivity, and a connection member for connecting the plurality of solar cell elements; applying the coating to the outer peripheral area while restricting the application of the coating in a restricted area that is provided in a part of the outer peripheral area of the surface; and connecting the plurality of solar cell elements by the connection member with the connection member crossed over the restricted area.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 7A and 7B are diagrams illustrating an intersection of the outer peripheral area of a solar cell element and a tab wiring according to a comparative example;

FIGS. 8A and 8B are diagrams illustrating an intersection of the outer peripheral area of a solar cell element and a tab wiring according to an embodiment;

FIGS. 9A and 9B are diagrams illustrating an intersection of the outer peripheral area of a solar cell element and a tab wiring according to a modification;

FIGS. 12A, 12B and 12C are top views of printing plates to be used for applying a coating to a light diffusion portion according to modifications.

DETAILED DESCRIPTION

The invention will now be described by reference to the preferred embodiments. This does not intend to limit the scope of the present invention, but to exemplify the invention.

Hereinafter, an embodiment for carrying out the present invention will be described in detail with reference to the accompanying drawing. In the explanation of the figures, like numerals represent like constituting elements, and duplicative explanations will be omitted appropriately.

Before describing the present invention in detail, the outline will be described. An embodiment of the present invention is a solar cell module in which a plurality of solar cell elements are connected with a connection member and sealed with an encapsulant. A light diffusion portion is provided on an outer peripheral area of a surface of the solar cell element. The outer peripheral area in which the light diffusion portion is provided has low collection efficiency of carriers due to its position near the end of the electrode for collecting the carriers or away from the end of the electrode and is unlikely to contributes to electricity generation even when light is incident. This is because even when carriers are generated after the light is incident on the outer peripheral area, there is a high possibility that the carriers would recombine before reaching an electricity collection electrode. In the present embodiment, by means of providing the light diffusion portion in the outer peripheral area, the electricity generation efficiency is enhanced by absorbing, in the inner area, light that would otherwise be absorbed in the outer peripheral area.

Further, in the present embodiment, a restricted area for restricting the formation of the light diffusion portion is provided in a part of the outer peripheral area of the surface of the solar cell element. The restricted area is disposed in an intersection on the surface of the solar cell element, which is a position where the outer peripheral area and the connection member intersect. If the formation of the light diffusion portion were not restricted at the intersection, the light diffusion portion would be pressed by the connection member. Then, a stress due to the connection member is applied to the solar cell element, and the reliability of the solar cell module may be reduced. In the present embodiment, restricting the formation of the light diffusion portion at the intersection prevents the connection member from coming in contact with the light diffusion portion. Thus, the reliability of the solar cell module is increased.

Figure 1:
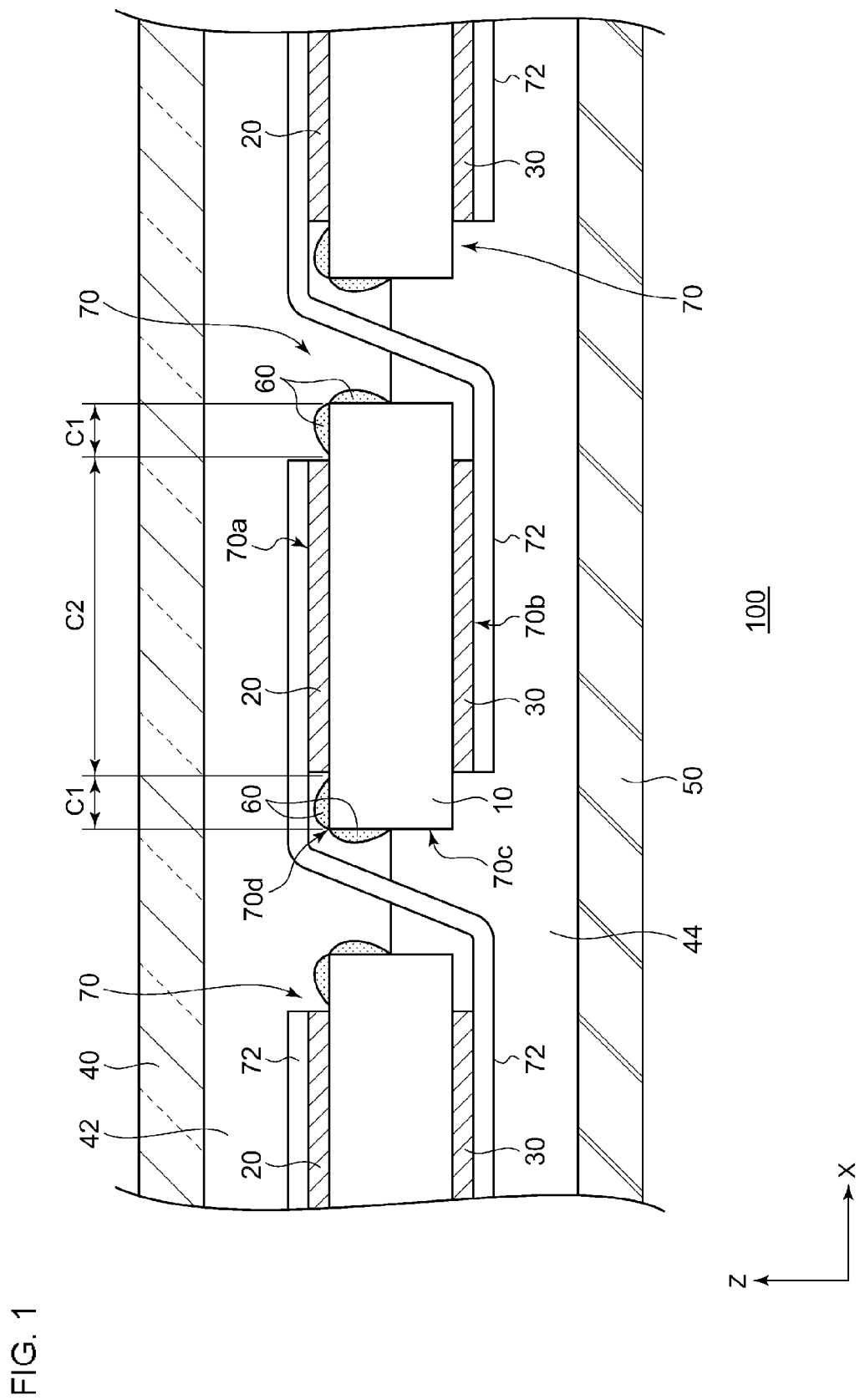
FIG. 1 is a cross-sectional view illustrating the structure of a solar cell module according to an embodiment.

FIG. 1 is a cross-sectional view illustrating a structure of the solar cell module 100 according to an embodiment.

The solar cell module 100 according to the present embodiment includes a plurality of solar cell elements 70, the light diffusion portion 60 provided in the outer peripheral area C1 of a light-receiving surface 70a which is one of the surfaces of the solar cell element 70, and a tab wiring 72 which is a connection member for connecting the adjacent solar cell elements 70 each other. Further, the solar cell module 100 includes a protection substrate 40, a back sheet 50, a first encapsulant 42 and a second encapsulant 44.

The light diffusion portion 60 is formed of a material having light diffusivity with respect to light having a wavelength to be absorbed by the solar cell element 70. Here, having light diffusivity refers to having a property of reflecting light incident on the light diffusion portion 60 mainly by diffuse reflection rather than by mirror reflection. The light diffusion portion 60 is formed of a material having an electrical insulation property. As the light diffusion portion 60 having such properties, an insulating white material in which particles of titania ($TiO_2$), alumina ($Al_2O_3$) or the like are dispersed in a resin substrate made of an epoxy resin or an acrylic resin is used for example. Accordingly, the light diffusion portion 60 has low conductivity and high light diffusivity as compared with a first metal electrode 20.

The light diffusion portion 60 needs a thickness such that the portion can sufficiently scatter the incident light. The thickness may be between 3 μm and 100 μm inclusive, and for example, it may be about 20 μm to 30 μm. The formation of the light diffusion portion 60 is restricted at the intersection on the outer peripheral area C1, where the tab wiring 72 crosses over the outer peripheral area C1. For detailed information on the restricted area where formation of the light diffusion portion 60 is restricted will be described later with reference to FIG. 2 and subsequent figures.

The light diffusion portion 60 is formed to cover at least a part of a side surface 70c of the solar cell element 70 so as to scatter the incident light heading toward the side surface 70c. By providing the light diffusion portion 60 on both the light-receiving surface 70a and the side surface 70c, light incident on the light diffusion portion 60 can be scattered effectively. The light diffusion portion 60 is formed so as to avoid a corner 70d formed of the light-receiving surface 70a and the side surface 70c. By forming the light diffusion portion 60 while avoiding the corner 70d, the amount of resin material required for formation of the light diffusion portion 60 can be reduced as compared with the case of providing the light diffusion portion 60 to cover the corner 70d. Further, when the light diffusion portion 60 is formed while avoiding the corner 70d, since the corner 70d is exposed even after the light diffusion portion 60 is formed, the outer periphery of the solar cell element 70 can be visually recognized easily. Therefore, when performing alignment using techniques of image recognition or the like, the pattern recognition is easy.

The light diffusion portion 60 directs light toward the inner area C2 of the light-receiving surface 70a by scattering the light entering toward the outer peripheral area C1. The light scattered by having been incident on the light diffusion portion 60 is, for example, totally reflected at a boundary surface between the protection substrate 40 and the outside air and enters the inner area C2. Since the outer peripheral area C1 is a position near or away from the end portion of the first metal electrode 20 that collects carriers, the outer peripheral area C1 has low collection efficiency of carriers as compared with the inner area C2, and thus hardly contributes to electricity generation even when light enters. By providing the light diffusion portion 60 in the outer peripheral area C1 like this, light that would otherwise be absorbed in the outer peripheral area C1 is made to be absorbed in the inner area C2.

The tab wiring 72 is an elongated metal foil, and copper foil coated with silver or aluminum foil is used for example. One end of the tab wiring 72 is connected to the first metal electrode 20 of the solar cell element 70 and the other end is connected to a second metal electrode 30 of another solar cell element 70 to be interconnected. Incidentally, the tab wiring 72 is disposed in the direction (x-direction) in which a bus bar electrode to be described later extends, and is connected to the bus bar electrode forming the first metal electrode 20 and the bus bar electrode forming the second metal electrode 30.

The protection substrate 40 and the back sheet 50 protect the solar cell element 70 from the external environment. The protect ion substrate 40 provided on the light-receiving surface 70a side allows light of a wavelength band to be absorbed by the solar cell element 70 for generating electricity to pass through. The protection substrate 40 is, for example, a glass substrate. The back sheet 50 is a resin substrate made of polyethylene terephthalate (PET) or polyimide, or a glass substrate like the protection substrate 40.

The first encapsulant 42 and the second encapsulant 44 is formed of a resin material such as EVA and polyimide. Thus, this prevents the penetration of moisture or the like into an electricity generation layer of the solar cell module 100, and in addition, improves the strength of the entire solar cell module 100. Incidentally, a white resin material obtained by dispersing particles such as titania may be used for the second encapsulant 44 on a back surface 70b side. Hence, by being scattered, light having reached the second encapsulant 44 after passing through the solar cell element 70 can be directed toward the solar cell element 70 again.

The solar cell element 70 includes the electricity generation layer 10, the first metal electrode 20, and the second metal electrode 30.

The electricity generation layer 10 includes the light-receiving surface 70a which is one of the surfaces of the solar cell element 70 and the back surface 70b which is one of the surfaces of the solar cell element 70 and is arranged back to back with the light-receiving surface 70a. Here, the light-receiving surface means a main surface where sunlight is mainly incident on the solar cell element 70, in particular, is a surface which most of the light incident on the electricity generation layer 10 enters.

The electricity generation layer 10 is a layer for generating photovoltaic power by absorbing the incident light and has, for example, a substrate made of a semiconductor material such as crystalline silicon, gallium arsenide (GaAs)

or indium phosphide (InP). The structure of the electricity generation layer 10 is not particularly limited but, in the present embodiment, has a heterojunction of an n-type single-crystal silicon substrate and an amorphous silicon. The electricity generation layer 10 is formed such that, for example, an i-type amorphous silicon layer, a p-type amorphous silicon layer in which boron (B) or the like is doped and a transparent conductive layer made of a transparent conductive oxide such as indium oxide are stacked in this order on the first main surface on the light-receiving surface 70a side of the n-type single-crystal silicon substrate. Further, an i-type amorphous silicon layer, an n-type amorphous silicon layer in which phosphorus (P) or the like is doped and a transparent conductive layer are stacked in this order on the second main surface on the back surface 70b side of the single-crystal silicon substrate.

In the present embodiment, an i-type amorphous layer, a p-type amorphous layer, and a transparent conductive layer provided on the first main surface of the semiconductor substrate that constitutes the electricity generation layer 10 are formed on the first main surface so as to cover substantially the entire surface of the first main surface including the outer peripheral area C1 and the inner area C2. Similarly, an i-type amorphous layer, an n-type amorphous layer, and a transparent conductive layer provided on the second main surface of the semiconductor substrate that constitutes the electricity generation layer 10 are formed on the second main surface so as to cover substantially the entire surface of the second main surface including the outer peripheral area C1 and the inner area C2. In other words, an amorphous semiconductor layer having one conductivity type corresponding to the p-type or the n-type is formed on the first main surface or the second main surface of the semiconductor substrate so as to cover substantially the entire surface of the main surface including the outer peripheral area C1.

The first metal electrode 20 and the second metal electrode 30 are electrodes for taking out the electric power generated by the electricity generation layer 10 to the outside. The first metal electrode 20 is provided on the light-receiving surface 70a of the solar cell element 70, and the second metal electrode 30 is provided on the back surface 70b opposed to the light-receiving surface 70a. The first metal electrode 20 and the second metal electrode 30 are formed of conductive materials including copper (Cu) or aluminum (Al) for example. Incidentally, these electrodes may include an electrolytic plating layer of copper (Cu), tin (Sn) or the like. However, being not limited to this, these electrodes may include other metals such as gold and silver, other conductive materials or a combination thereof.

Figure 2:
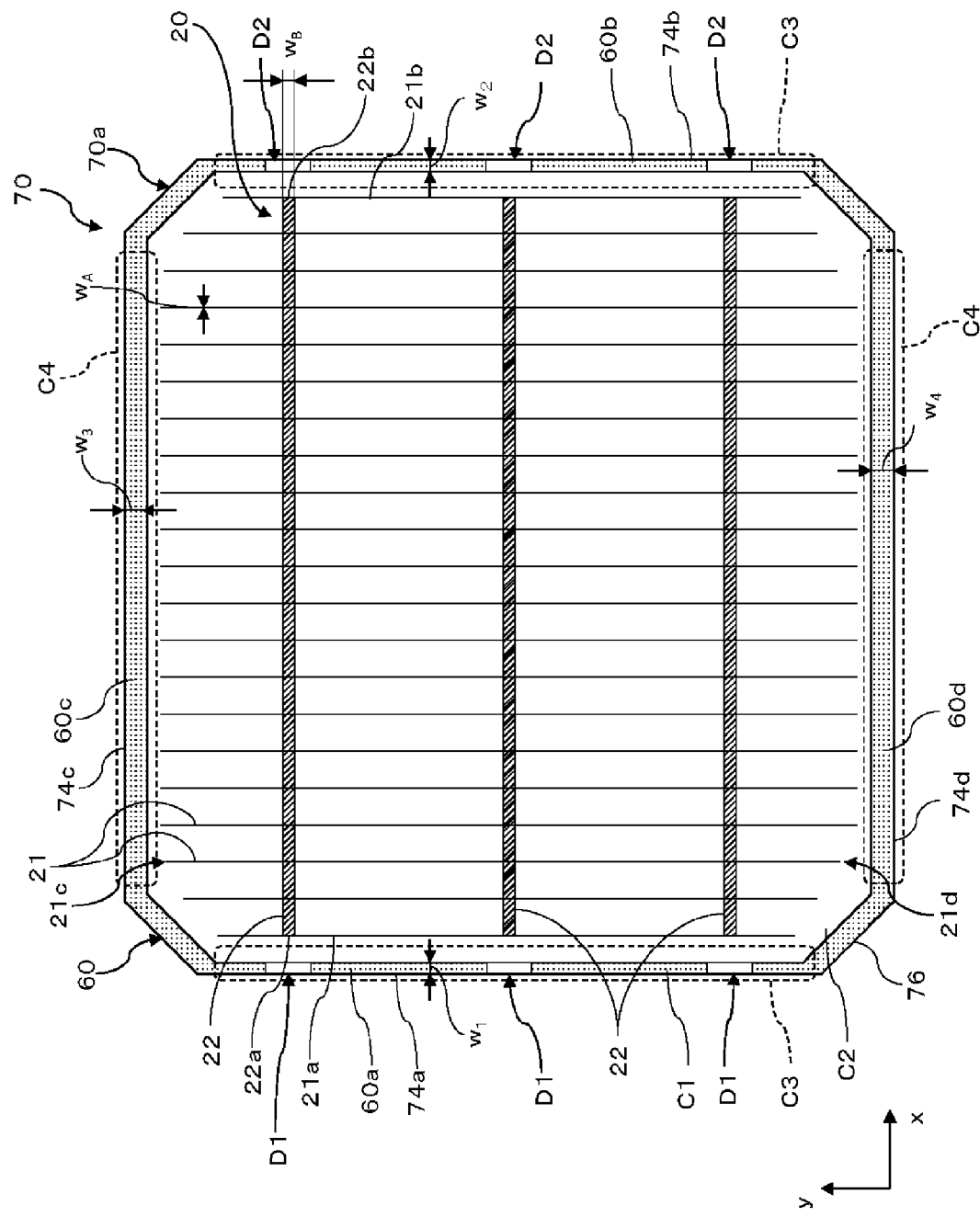
FIG. 2 is a top view illustrating a light-receiving surface of a solar cell element according to an embodiment.

FIG. 2 is a top view illustrating the light-receiving surface 70a of the solar cell element 70 according to an embodiment.

The light-receiving surface 70a has an octagonal shape having four sides 74a to 74d, and corner portions 76 with the corners cut off at four positions. Hereinafter, for convenience of the description, each of the four sides 74a to 74d are also referred to as a left side 74a, a right side 74b, an upper side 74c and a lower side 74d. Here, the left side 74a and the right side 74b are sides extending in parallel to finger electrodes 21 and are sides extending in the direction (y-direction) perpendicular to bus bar electrodes 22. Further, the upper side 74c and the lower side 74d are sides extending in parallel to the bus bar electrodes 22 and are sides extending in the direction (x-direction) perpendicular to the finger electrodes 21.

Further, an area along the left side 74a or the right side 74b in the outer peripheral area C1, in other words, an area close to left ends 22a or right ends 22b of the bus bar electrodes 22 is also referred to as a bus bar end area C3. On the other hand, the area along the upper side 74c or the lower side 74d, in other words, an area close to upper ends 21c or lower ends 21d of the finger electrodes 21 is also referred to as a finger end area C4. Since the bus bar end area C3 is close to the bus bar electrodes 22, and also, the left or the right end finger electrode 21a or 21b extends close thereto, its collection efficiency of carriers is high as compared with the finger end area C4. In any area of the bus bar end area C3 and the finger end area C4, there is a tendency such that as the position approaches the sides 74, the electricity collection efficiency reduces, and as the position approaches the center, the electricity collection efficiency increases. The areas along the corner portions 76 are also areas having low electricity collection efficiency.

The first metal electrode 20 includes a plurality of finger electrodes 21 extending in parallel to each other, and three bus bar electrodes 22 extending perpendicularly to the finger electrodes 21.

The finger electrodes 21 are distributed over substantially the entire surface of the light-receiving surface 70a to collect the generated electric power efficiently. Among the plurality of finger electrodes 21 provided in parallel with each other, the left end finger electrode 21a is provided near the left side 74a, and the right end finger electrode 21b is provided near the right side 74b. Further, the upper ends 21c of the finger electrodes 21 extending in the y-direction are provided near the upper side 74c, and the lower ends 21d of the finger electrodes 21 are provided near the lower side 74d.

The finger electrodes 21 are the electrodes formed on the light-receiving surface 70a, and thus are desirable to be thinly formed so as not to block light incident on the electricity generation layer 10. For example, the width $w_A$ in the transverse direction of the finger electrode 21 may be about 80 μm.

The bus bar electrodes 22 are provided to extend in the x-direction from the left end finger electrode 21a to the right end finger electrode 21b so as to connect each of the plurality of finger electrodes 21 arranged in parallel. Thus, the left ends 22a of the bus bar electrodes 22 are provided in the vicinity of the left side 74a, and the right ends 22b of the bus bar electrodes 22 are provided in the vicinity of the right side 74b.

The bus bar electrode 22 needs to be thin so as not to block the light incident on the electricity generation layer 10, and in addition, needs to be thick to some extent so as to be able to allow the electric power collected from the plurality of finger electrodes 21 to flow efficiently. For example, a width $w_B$ of the bus bar electrode 22 in the transverse direction may be about 100 μm.

The second metal electrode 30 provided on the back surface 70b, similarly to the first metal electrode 20, includes a plurality of finger electrodes extending parallel to each other and three bus bar electrodes extending perpendicularly to the finger electrodes. Incidentally, since the back surface 70b is not a main surface on which sunlight is mainly incident, the electricity collection efficiency may be enhanced by providing larger number of the finger electrodes on the back surface 70b side than the light-receiving surface 70a side.

The light diffusion portion 60 is provided along the sides 74 and the corner portions 76 on the light-receiving surface 70a, and is provided so as to cover the entire surface of the outer peripheral area C1 excluding the restricted areas D1 and D2. The restricted areas D1 and D2 are provided near the left ends 22a or the right ends 22b of the bus bar electrodes 22 in the outer peripheral area C1. The restricted areas D1 and D2 are areas in which the formation of the light diffusion portion 60 is restricted, and the light diffusion portion 60 is not provided in these areas. Accordingly, in the restricted areas D1 and D2, a transparent electrode layer forming the light-receiving surface 70a is exposed.

The light diffusion portion 60 has the widths $w_1$ to $w_4$ in the transverse direction perpendicular to the sides 74 or the corner portions 76, which are larger than the width $w_A$ of the finger electrode 21 or the width $w_B$ of the bus bar electrode 22, so that incident light toward the outer peripheral area C1 is effectively made incident on the inner area C2. For example, the light diffusion portion 60 is provided so that its widths $w_1$ to $w_4$ in the transverse direction are 200 µm or more.

The light diffusion portion 60 includes first light diffusion portions 60a and 60b provided along the left side 74a and the right side 74b and second light diffusion portions 60c and 60d provided along the upper side 74c and the lower side 74d.

The first light diffusion portions 60a and 60b are formed to be small in width in the transverse direction as compared with the second light diffusion portions 60c and 60d. This is because the bus bar end area C3 has relatively high electricity collection efficiency in the outer peripheral area C1, and it is desirable to provide the light diffusion portion 60 in areas adjacent to the left side 74a and right side 74b where the electricity collection efficiency reduces. The widths $w_1$ and $w_2$ of the first light diffusion portions 60a and 60b, for example, may be between 100 µm and 900 µm inclusive, and preferably, may be about 600 µm. The first light diffusion portions 60a and 60b are not formed in the restricted areas D1 and D2 in the outer peripheral area C1 corresponding to the left side 74a and the right side 74b.

On the other hand, the second light diffusion portions 60c and 60d are formed so that their widths in the transverse direction become large as compared with the first light diffusion portions 60a and 60b. This is because the electricity collection efficiency of the finger end area C4 is relatively low in the outer peripheral area C1, and thus increasing the width of the light diffusion portion 60 for diffusing light to other areas is more effective for easily increasing the electricity generation efficiency. The widths $w_3$ and $w_4$ of the second light diffusion portions 60c and 60d, for example, may be between 300 µm and 3 mm inclusive, and preferably, may be about 1 mm.

The light diffusion portion 60 is also provided in the areas along the corner portions 76. The corner portions 76 are located near the ends of the finger electrodes, and since the electricity collection efficiency is low in the areas, it is possible to enhance the electricity generation efficiency by providing light diffusion portions at the corner portions 76. The widths of the light diffusion portions provided at the corner portions 76, for example, may be between 300 µm and 3 mm inclusive, and preferably may be about 1 mm.

Figure 3:
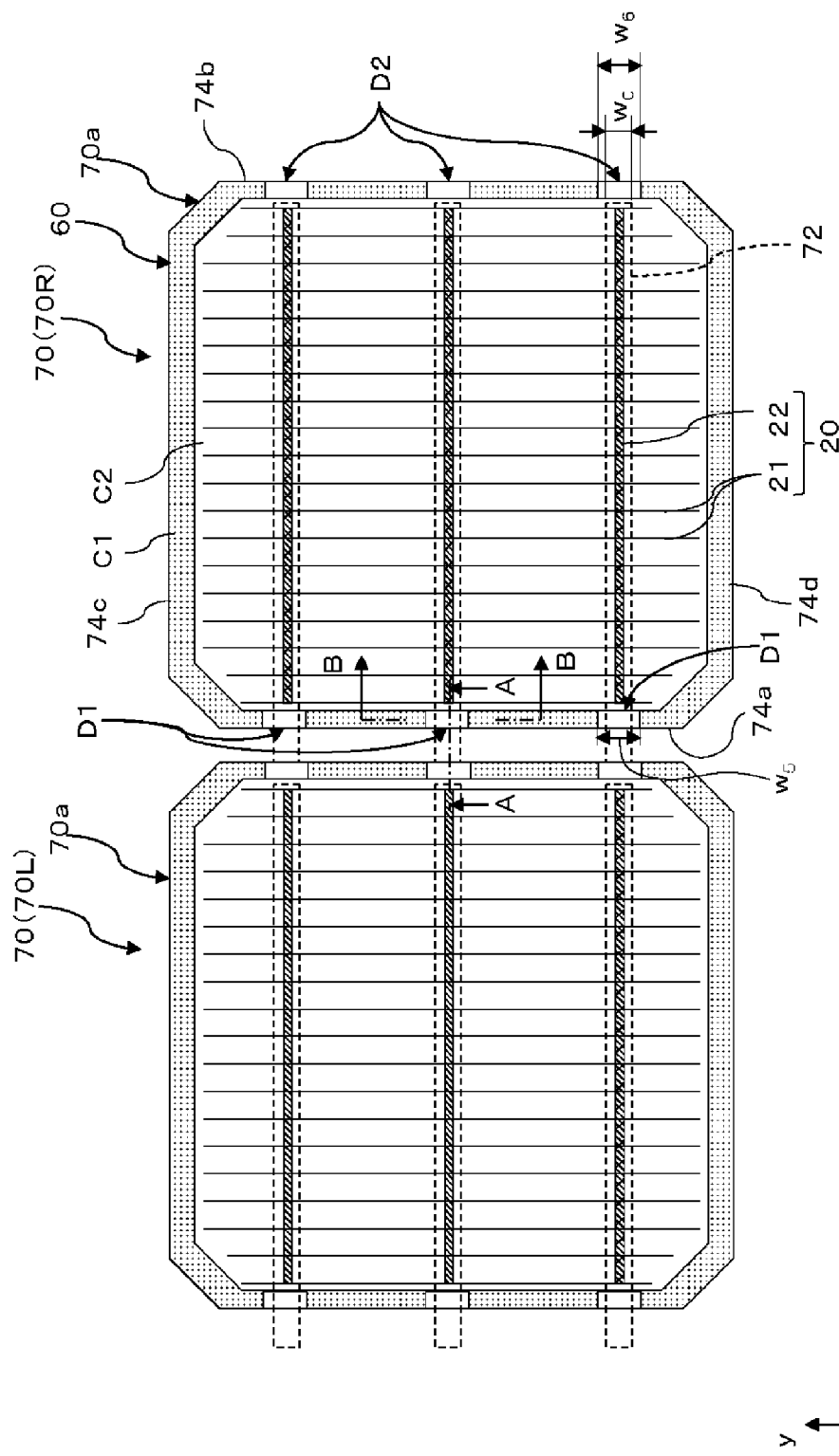
FIG. 3 is a top view illustrating restricted areas of a solar cell element according to an embodiment.

FIG. 3 is a top view illustrating the restricted areas D1 and D2 of the solar cell element 70 according to an embodiment. This figure shows the manner of connecting two solar cell elements 70 by the tab wiring 72, and the positions where the tab wirings 72 are provided are indicated by broken lines. The tab wiring 72 is provided along the bus bar electrode 22, and the tab wiring 72 connected with the light-receiving surface 70a of a solar cell element 70R shown on the right side of the figure is connected with the back surface of a solar cell element 70L shown on the left side of the figure. Thus, the tab wiring 72 intersects the left side 74a on the light-receiving surface 70a side of the right side solar cell element 70R, and intersects the right side 74b on the back surface side of the left side solar cell element 70L.

The first restricted area D1 is provided at the intersection where the tab wiring 72 intersects the outer peripheral area C1 of the light-receiving surface 70a. In the present embodiment, since the tab wiring 72 intersects the left side 74a on the light-receiving surface 70a, the first restricted area D1 is provided at a position corresponding to the left side 74a in the outer peripheral area C1. The width $w_5$ of the first restricted area D1 in the direction along the left side 74a (y-direction), is equivalent to or a little larger than the width $w_C$ of the tab wiring 72 in the transverse direction. Thus, the contact between the light diffusion portion 60 and the tab wiring 72 can be prevented in the first restricted area D1.

The second restricted area D2 is provided at a position corresponding to the right side 74b in the outer peripheral area C1. The width $w_6$ of the second restricted area D2 in the direction along the right side 74b (y-direction) is equivalent to or a little larger than the width $w_C$ of the tab wiring 72 in the transverse direction. In the present embodiment, since the tab wiring 72 does not intersect the right side 74b on the light-receiving surface 70a, the second restricted area D2 is not at an intersection where the tab wiring 72 intersect the outer peripheral area C1 of the light-receiving surface 70a. However, by providing the second restricted area D2 on the right side 74b in response to the first restricted area D1 provided on the left side 74a, the shape of the light diffusion portion 60 can be bilaterally symmetric. Thus, at the time of a right and left reverse connection mode of the tab wiring 72, it is possible to cope with a case of connecting the light-receiving surface 70a on the left side solar cell element 70L and the back surface of the right side solar cell element 70R.

Next, an example of a method for manufacturing the solar cell module 100 will be described.

Figure 4:
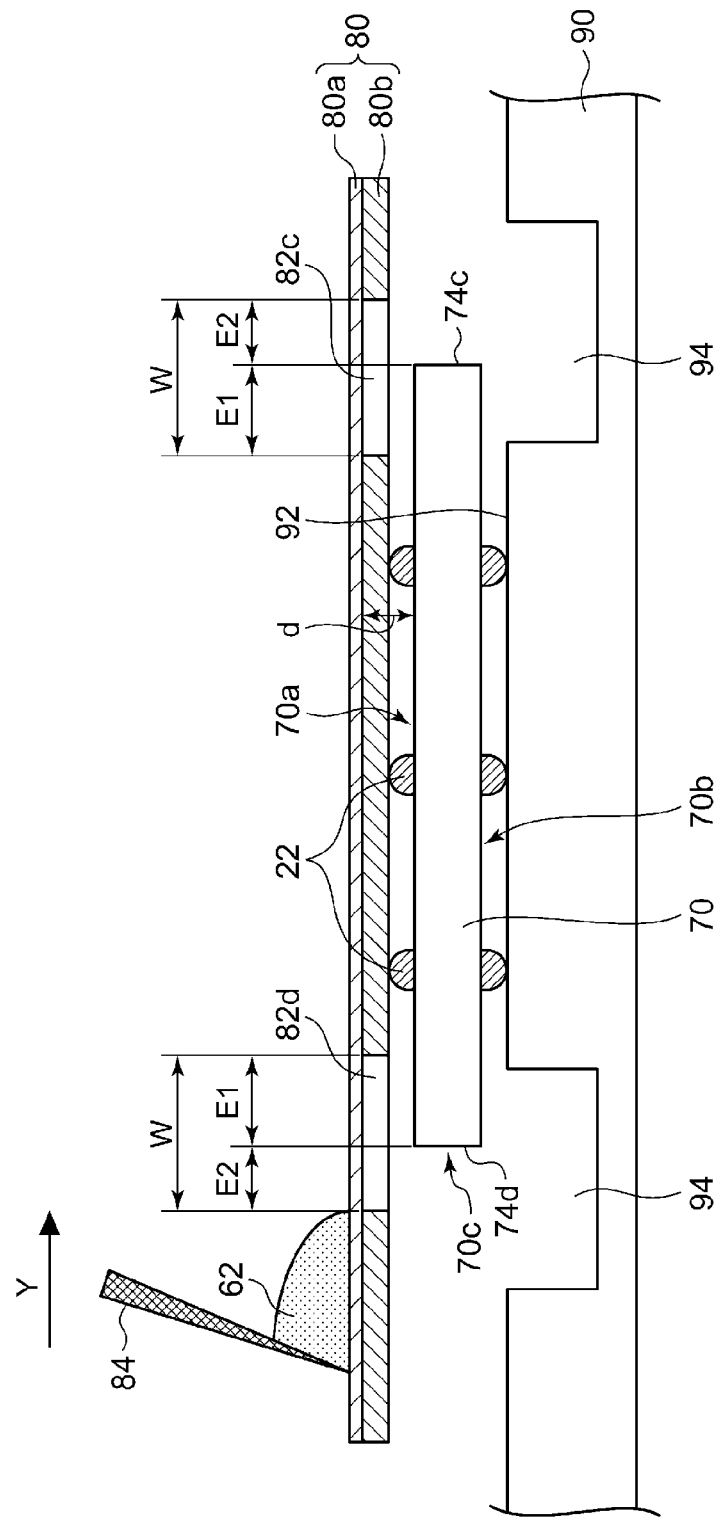
FIG. 4 is a diagram illustrating a process of applying a coating to a light diffusion portion according to an embodiment by screen printing.
Figure 5:
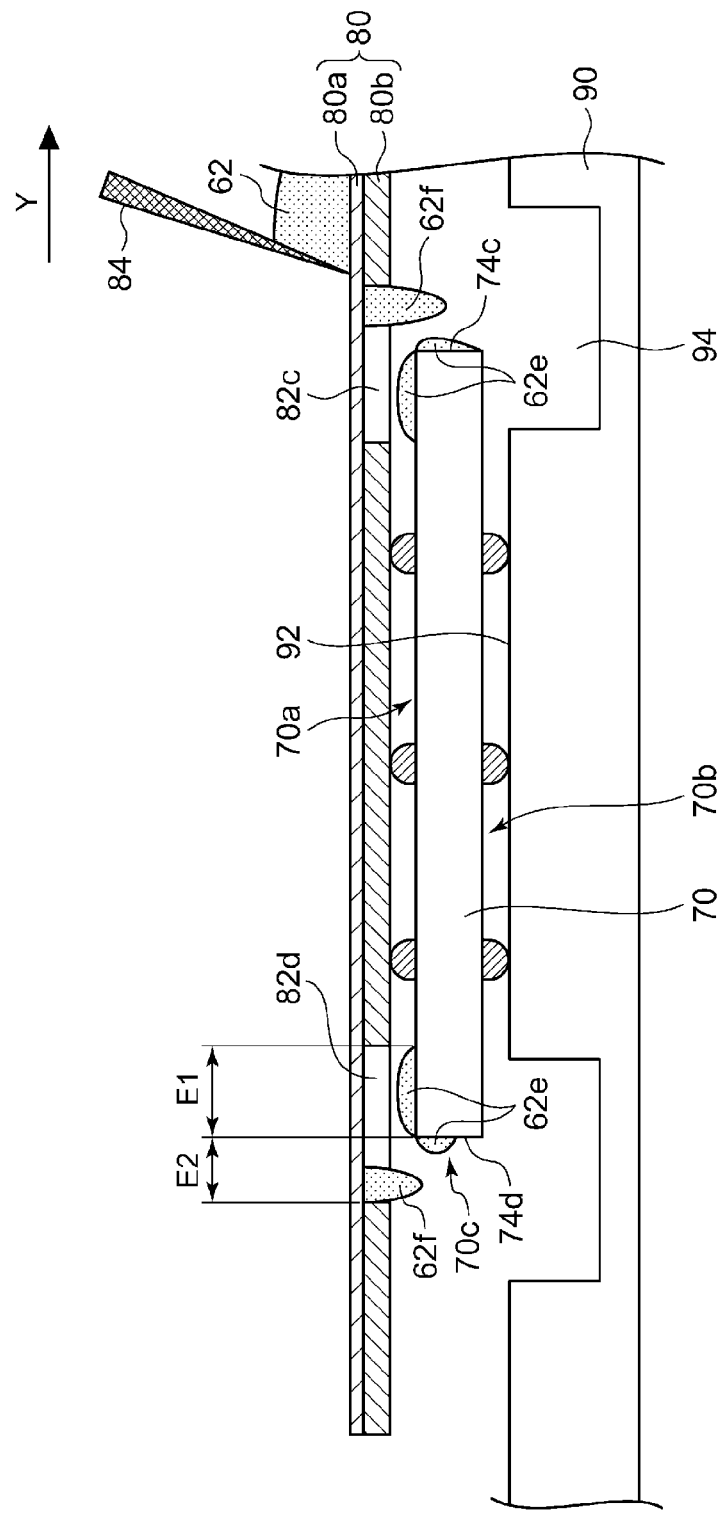
FIG. 5 is a diagram illustrating a process of applying a coating to the light diffusion portion according to the embodiment by screen printing.

FIGS. 4 and 5 are diagrams illustrating processes of applying the coating by screen printing to the light diffusion portion according to an embodiment. The solar cell element 70 is disposed on a stage 90 provided with grooves 94. Thereafter, a printing plate 80 having openings 82c and 82d is disposed over the light-receiving surface 70a of the solar cell element 70, and by moving a squeegee 84 in the Y-direction, the coating 62 is applied to the light-receiving surface 70a via the printing plate 80.

The coating 62 is applied by moving the squeegee 84 in the Y-direction in which the finger electrodes extend, after forming the finger electrodes and the bus bar electrodes 22 on the light-receiving surface 70a of the solar cell element 70. By applying the coating 62 after providing the bus bar electrodes 22, the distance d between the light-receiving surface 70a and a mesh 80a can be secured as compared with the case where there are no bus bar electrodes 22, and it is possible to thicken the coating 62. Further, by printing in the direction in which the finger electrodes extend, damage to the finger electrodes that may occur during printing can be prevented as compared with the case of printing in a direction crossing the finger electrodes.

The printing plate 80 has a metal mesh 80a, an emulsion 80b arranged corresponding to the pattern of the printing plate 80. An area where the emulsion 80b is provided is an area where the coating 62 is not applied, and the areas W where the emulsion 80b is not provided corresponds to the openings 82c and 82d of the printing plate 80. The opening area W is provided so that the outer periphery is larger than an application area E1 on the light-receiving surface 70a, and the opening area W extends over both the application area E1 and an extension area E2 provided so as to surround the outer periphery of the application area E1. By providing the opening even in an area corresponding to the extension area E2, the coating 62 can be applied also to the side surface 70c.

Incidentally, since the solar cell element 70 is not provided under the extension area E2, a coating 62f extruded by the squeegee 84 tends to accumulate in a position corresponding to the extension area E2. By utilizing this accumulated coating 62f, the coating can be applied on the side surface 70c. However, when the solar cell element 70 is placed on a flat stage, there is a possibility that the coating 62f is attached to the stage. Then, the coating will bond the stage and the solar cell element 70 together, and thus at the time of attempting to raise the solar cell element 70 from the stage, the solar cell element 70 can be damaged by a stress applied thereto. Therefore, the stage 90 on which the grooves 94 are provided at positions corresponding to the outer periphery of the solar cell element 70 is used. This prevents the adhesion of the coating 62 to the stage 90.

Figure 6:
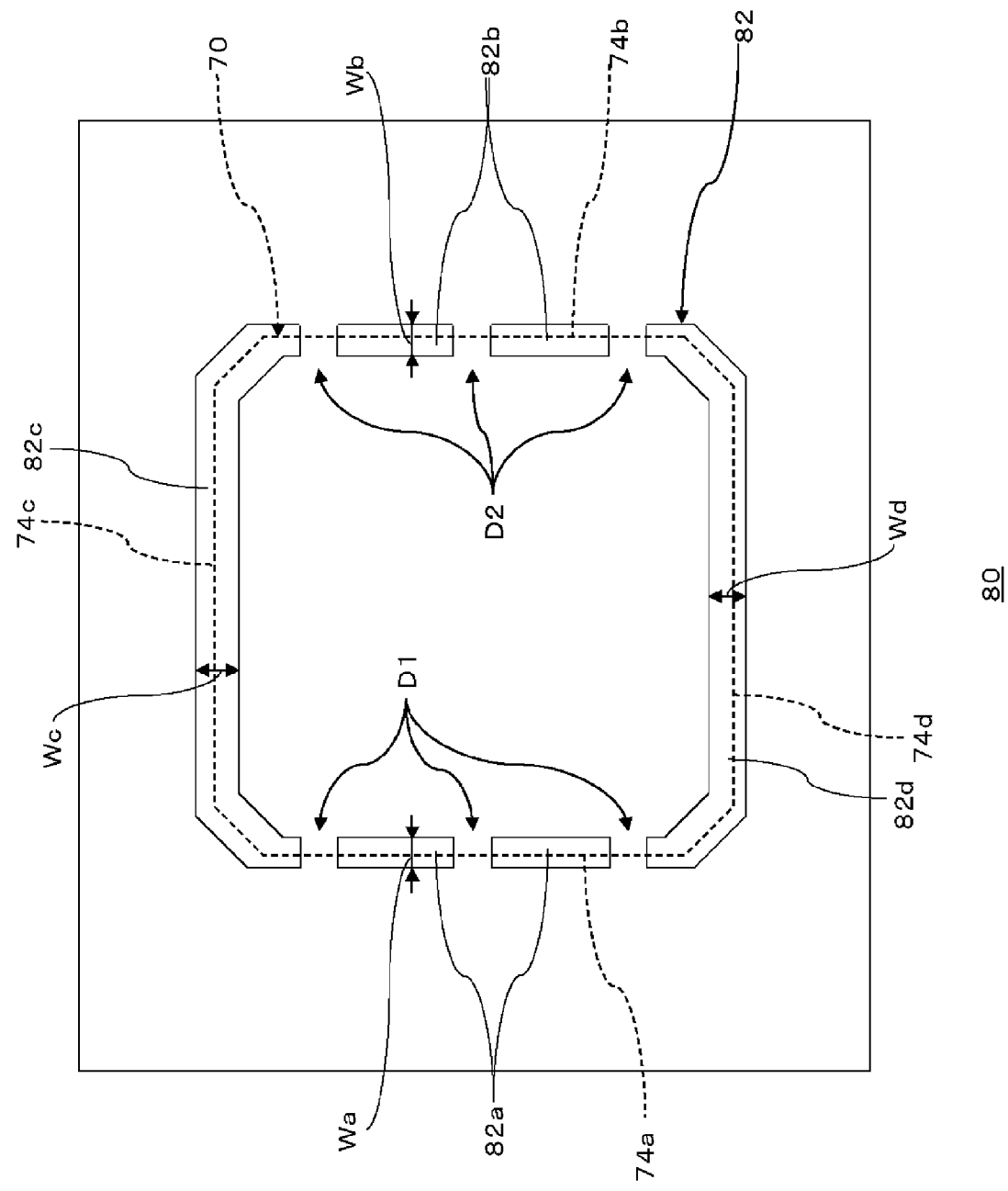
FIG. 6 is a top view of a printing plate to be used for applying a coating to a light diffusion portion according to an embodiment.

FIG. 6 is a top view illustrating the printing plate 80 to be used for applying the coating on the light diffusion portion according to an embodiment. The figure shows a position corresponding to the outer periphery of the solar cell element 70 by broken lines.

The printing plate 80 has a pattern 82 having a frame shape corresponding to the shape of the outer peripheral area C1 of the light-receiving surface 70a. The pattern 82 has openings 82a to 82d in an area corresponding to the four sides 74a to 74d of the solar cell element 70. On the other hand, the openings 82a and 82b corresponding to the left side 74a and right side 74b are provided while avoiding the position corresponding to the restricted areas D1 and D2 of the solar cell element 70. Thus, the printing plate 80 has the pattern 82 having no openings provided at positions corresponding to the restricted areas D1 and D2 of the solar cell element 70. By using the printing plate 80 having the pattern 82 like this, the coating 62 can be applied to the outer peripheral area C1 except the restricted areas D1 and D2. In other words, the use of the pattern 82 allows the coating to be applied to the outer peripheral area C1 while restricting the application of the coating in the restricted areas D1 and D2 provided on a part of the outer peripheral area C1.

Further in the pattern 82, the opening widths Wa and Wb of the openings 82a and 82b corresponding to the left side 74a and the right side 74b are smaller than the opening widths Wc and Wd of the openings 82c and 82d corresponding to the upper side 74c and the lower side 74d. By using the printing plate 80 having the pattern 82 like this, the width in the transverse direction of the coating 62 applied along the left side 74a and the right side 74b can be made smaller than the width in the transverse direction of the coating 62 applied along the upper side 74c and the lower side 74d.

Thereafter, the light diffusion portion 60 is formed by curing a coating 62e applied by screen printing.

The solar cell elements 70 on which the light diffusion portion 60 is formed are connected by the tab wiring 72. At this time, the tab wiring 72 is bonded to the light-receiving surface 70a of the solar cell element 70 so as to cross over the first restricted area D1 where the light diffusion portion 60 is not formed. After the solar cell elements 70 are connected by the tab wiring 72, the first encapsulant 42 and the protection substrate 40 are disposed on the light-receiving surface 70a side, and the second encapsulant 44 and the back sheet 50 are disposed on the back surface 70b. Then, the solar cell element 70 sandwiched between the protection substrate 40 and the back sheet 50 is subjected to thermal compression bonding. Thus, the first encapsulant 42 and the second encapsulant 44 are fused to form the solar cell module 100 illustrated in FIG. 1.

The following describes effects achieved by the solar cell module 100 according to the present embodiment. First, a description will be made of a solar cell element according to the comparative example on which the restricted area is not provided, to describe issues of the comparative example. Next, a description will be made of effect achieved by the solar cell module 100 according to the present embodiment.

FIGS. 7A and 7B are diagrams illustrating an intersection of the outer peripheral area C1 of a solar cell element 170 and a tab wiring 172 according to a comparative example. FIG. 7A is a view corresponding to a cross-sectional view taken along line A-A in FIG. 3, and FIG. 7B is a view corresponding to a cross-sectional view taken along line B-B in FIG. 3 or FIG. 7A. The solar cell element 170 according to the comparative example has the same structure as the solar cell element 70 according to the present embodiment but differs from the embodiment in that the light diffusion portion 160 is provided to the intersection at which the tab wiring 172 intersect the outer peripheral area C1 of a light-receiving surface 170a.

In the comparative example, since the tab wiring 172 is arranged to be in contact with the light diffusion portion 160, the light diffusion portion 160 is pressed by the tab wiring 172. A surface 160a of the light diffusion portion 160 may have a fine irregularities rather than a flat surface as illustrated in FIG. 7B, and in this case, the surface 160a of the light diffusion portion 160 is in contact with the tab wiring 172 at a point P protruding toward the tab wiring 172. As a result, pressing force from the tab wiring 172 concentrates at the point P and the concentrated force is thus applied to the solar cell element 170. In this manner, large force will be applied locally to the solar cell element 170, which causes a risk that the solar cell element 170 may be damaged. Then, this may lead to a decrease in the yield in the fabrication process of the solar cell module, or a decrease in long-term reliability.

FIGS. 8A and 8B are diagrams illustrating an intersection of the outer peripheral area C1 of the solar cell element 70 and the tab wiring 72 according to an embodiment. FIG. 8A shows a cross-sectional view taken along line A-A in FIG. 3, and FIG. 8B shows a cross-sectional view taken along line B-B in FIG. 3 or FIG. 8A. In the present embodiment, since the light diffusion portion 60 is not provided in the restricted area D1, the tab wiring 72 is not in contact with the light diffusion portion 60, and a clearance $h_0$ is provided between the tab wiring 72 and the light-receiving surface 70a. Further, the tab wiring 72 is provided so as to be in contact with the corner 70d extending along a side of the solar cell element 70, and the tab wiring 72 is supported by the corner 70d. Therefore, the solar cell element 70 can receive pressing force from the tab wiring 72 by using this side. In this way, by not providing the light diffusion portion 60 on the restricted area D1, it is possible to prevent the force due to the tab wiring 72 from being concentrated to a point in the outer peripheral area C1 to be applied to the solar cell element 70. As a result, a decrease in the yield or in reliability which concerns in the comparative example can be prevented.

Further, in the present embodiment, the widths of the first light diffusion portions 60a and 60b provided along the left side 74a and right side 74b are small, and the widths of the second light diffusion portions 60c and 60d provided along the upper side 74c and the lower side 74d are large. By providing the second light diffusion portions 60c and 60d which are set to be wide to the finger end area C4 having a low electricity collection efficiency, light incident on the finger end area C4 can be effectively utilized. Further, also in the bus bar end area C3 in which the electricity collection efficiency is relatively high, by providing the first light diffusion portions 60a and 60b which are set to be narrow, light incident on the vicinity of the left side 74a or the right side 74b can be effectively utilized. This can enhance the electricity generation efficiency of the solar cell module 100.

Further, in the present embodiment, since the light diffusion portion 60 is provided in the outer peripheral area C1 of the light-receiving surface 70a, the sealing properties of the solar cell module 100 can be enhanced. This is because the light diffusion portion 60 has a high adhesion property to the first encapsulant 42 than the transparent electrode layer exposed on the light-receiving surface 70a of the solar cell element 70. Further, since the second light diffusion portions 60c and 60d are wider than the first light diffusion portions 60a and 60b, the adhesion strength in the x-direction along the upper side 74c and the lower side 74d is enhanced. The tab wiring 72 extends in the x-direction, and stress in the x-direction tends to be applied to the solar cell module 100 due to the connection of the tab wiring 72. In the present embodiment, since it is possible to increase the adhesion strength in the x-direction due to the wide second light diffusion portions 60c and 60d, the reliability of the solar cell module 100 can be enhanced.

Further, in the present embodiment, by providing the light diffusion portion 60 in the outer peripheral area C1 of the light-receiving surface 70a and the side surface 70c, the outer peripheral end of the solar cell element 70 can be protected. Further, the solar cell element 70 can have a strong structure against the force applied in the bending direction of the light-receiving surface 70a of the solar cell element 70, by providing the light diffusion portion 60 along the four sides 74. Moreover, since the light diffusion portion 60 is provided around the corner 70d of the solar cell element 70, a strong structure against an impact applied to the corner 70d can be secured by protecting the corner 70d.

Further, in the present embodiment, by applying the coating 62 in the direction in which the finger electrodes extend, the positions of the upper side 74c and the lower side 74d whose application widths of the coating 62 have been increased can be employed as the print start position and the print end position. If the print start position or the print end position were the left side 74a or the right side 74b whose application width of the coating 62 is small, it would be difficult to apply the coating 62 with a uniform width due to the small application width. In the present embodiment, since the print start position and the print end position are set to be the upper side 74c or the lower side 74d having a large application width, application defects can be prevented when the coating 62 is applied.

One aspect is as follows. The solar cell module 100 of an aspect includes:

the plurality of solar cell elements 70 each having the surface (light-receiving surface 70a);

the light diffusion portion 60 provided in the outer peripheral area C1 of the surface (light-receiving surface 70a); and the connection member (tab wiring 72) for connecting the plurality of solar cell elements 70, and the outer peripheral area C1 has the restricted areas D1 and D2 where the formation of the light diffusion portion 60 is restricted, in a part of the outer peripheral area C1, and the restricted areas D1 and D2 are provided at intersections of the outer peripheral area C1 and the connection member (tab wiring 72).

The solar cell element 70 has the bus bar electrode 22 extending along the connection member (tab wiring 72) on the surface (light-receiving surface 70a), the restricted areas D1 and D2 may be provided near the end of the bus bar electrode 22 (left end 22a and right end 22b).

The light diffusion portion 60 may be provided while avoiding the restricted areas D1 and D2.

Another aspect is a method for manufacturing the solar cell module 100. This method includes, preparing the plurality of solar cell elements 70 each having the surface (light-receiving surface 70a), the coating 62 having light diffusivity, and the connection member for connecting the plurality of solar cell elements 70 (tab wiring 72), applying the coating while restricting the application of the coating 62 in the restricted areas D1 and D2 provided in a part of the outer peripheral area C1 of the surface (light-receiving surface 70a), and connecting the plurality of solar cell elements 70 by the connection member (tab wiring 72) with the connection member (tab wiring 72) crossed over the restricted areas D1 and D2.

(Modification 1)

FIGS. 9A and 9B are diagrams illustrating an intersection of the outer peripheral area C1 of the solar cell element 70 and the tab wiring 72 according to a modification. In the modification, although formation of the light diffusion portion 60 is restricted in the restricted area D1 similarly to the embodiment described above, the modification differs in that the light diffusion portion 60 is formed to be thinner than other areas. Hereinafter, a description will be made focusing on differences from the embodiment described above.

The light diffusion portion 60 is provided on the entire surface of the outer peripheral area C1 containing the restricted area D1. On the other hand, the thickness of the light diffusion portion 60 provided in the restricted area D1 in the direction (z-direction) crossing the light-receiving surface 70a is restricted as compared with the light diffusion portion 60 provided in other areas. The thickness $d_1$ of the light diffusion portion 60 provided in the restricted area D1 is smaller than the thickness $d_0$ of the light diffusion portion 60 provided in other areas. For example, the thickness $d_1$ of the light diffusion portion 60 provided in the restricted area D1 is half or less of the thickness $d_0$ of the light diffusion portion 60 provided in other areas, and preferably, is one third or less thereof. Thus, a clearance $h_1$ between the light diffusion portion 60 and the tab wiring 72 is ensured in the restricted area D1 to prevent the tab wiring 72 from coming into contact with the light diffusion portion 60. Further, the solar cell element 70 can prevent force due to the tab wiring 72 from concentrating into a point to be applied to the solar cell element 70, because the solar cell element 70 can support the tab wiring 72 at the corner 70d.

Figure 10A:
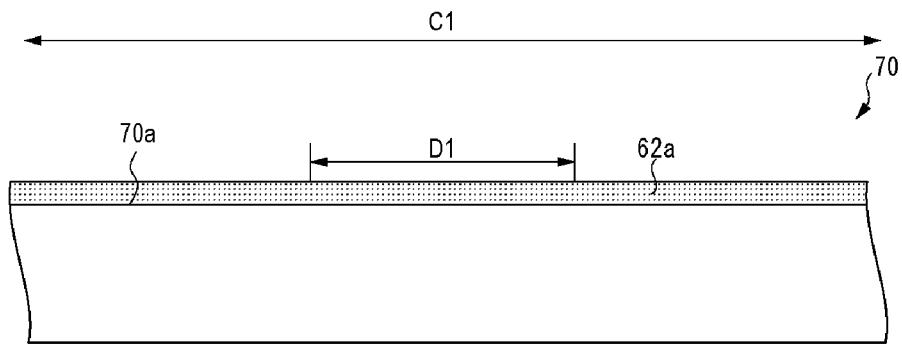
FIGS. 10A, 10B and 10C are diagrams illustrating processes of applying a coating to a light diffusion portion according to a modification.
Figure 10B:
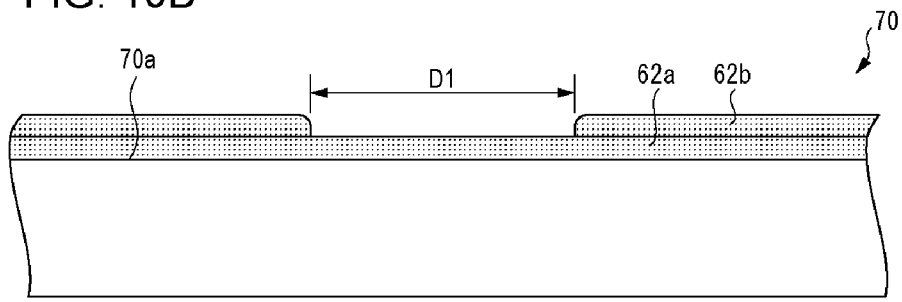
Figure 10C:
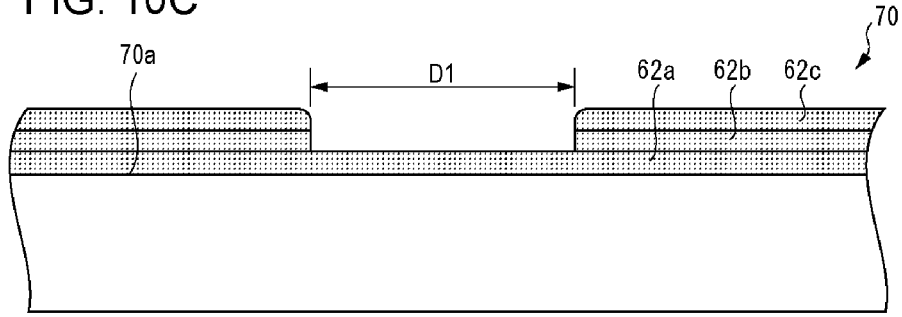
Figure 11:
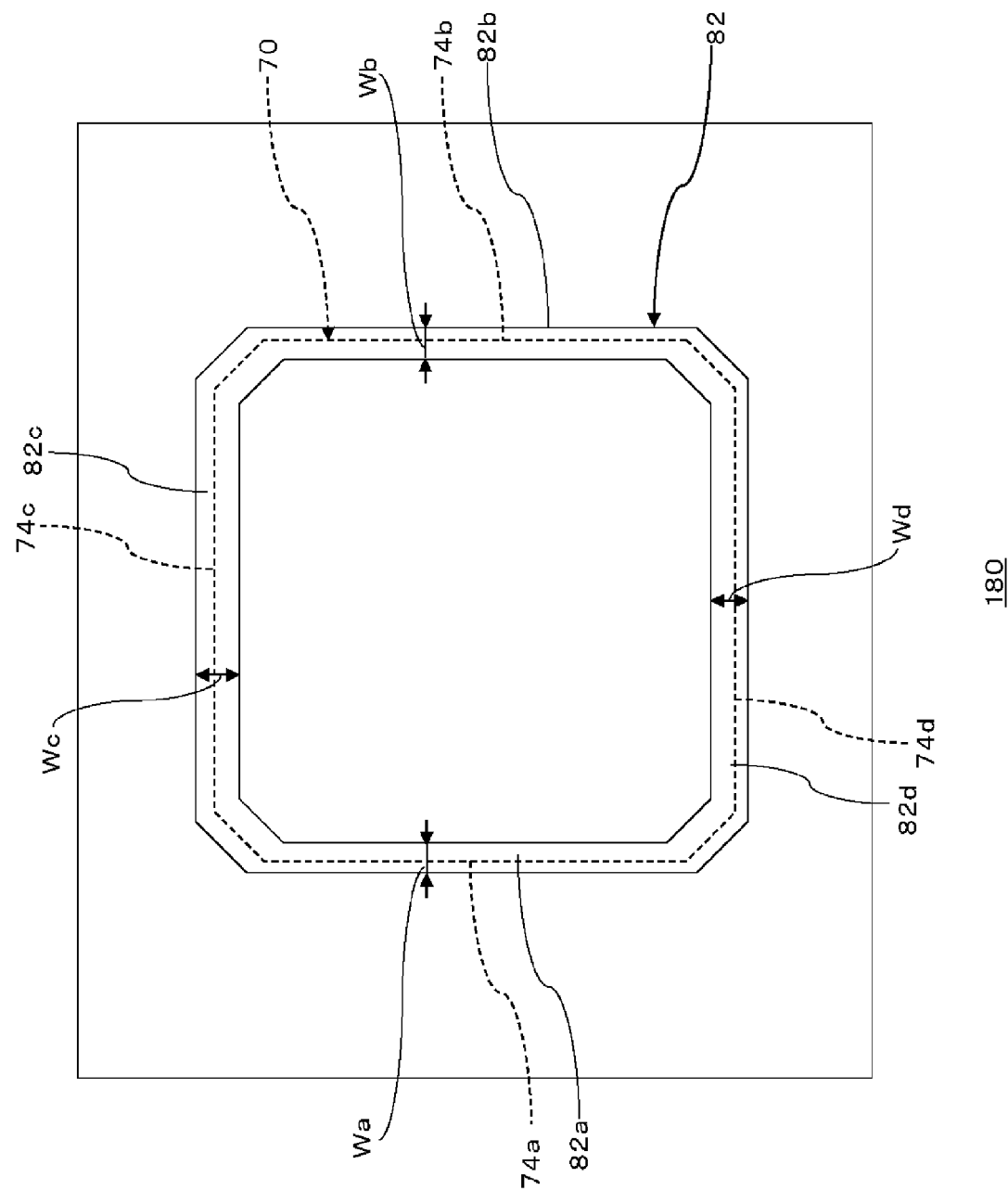
FIG. 11 is a top view of a printing plate to be used for applying a coating to a light diffusion portion according to a modification.

FIGS. 10A to 10C are diagrams illustrating processes of applying the coating to the light diffusion portion according to a modification, and FIG. 11 is a top view illustrating a printing plate 180 to be used for applying the coating to the light diffusion portion according to the modification.

First, as illustrated in FIG. 10A, a coating 62a is applied on the entire surface of the outer peripheral area C1 including the restricted area D1. In this case, the printing plate 180 according to the modification illustrated in FIG. 11 is used. The printing plate 180 according to the modification, being different from the printing plate 80 illustrated in FIG. 6, has a pattern 182 with openings 182a to 182d provided corresponding to the entire area of the outer peripheral area C1.

By using the printing plate 180 having the pattern 182 like this, the coating 62a can be applied on the entire surface of the outer peripheral area C1.

As illustrated in FIG. 10B, subsequently a coating 62b is applied in the outer peripheral area C1 except the restricted area D1. The coating 62b to be applied for the second time is applied on the top of the coating 62a applied for the first time. Accordingly, the thickness of the coating 62a applied to the restricted area D1 is decreased, and the thickness of coatings 62a and 62b applied to the areas other than the restricted area D1 can be increased.

Further, as illustrated in FIG. 10C, a coating 62c may be applied to the outer peripheral area C1 except the restricted area D1. Thus, by applying the coating 62c to be applied for the third time on the coating 62b applied for the second time, the thickness of the coatings 62a to 62c of the outer peripheral area C1 except the restricted area D1 can be increased. When the thicknesses of the coatings 62a to 62c to be applied in the first to third steps are equivalent to one another, the thickness of the coating 62a applied to the restricted area D1 can be controlled to be about one third of the thickness of the coatings 62a to 62c applied to areas other than the restricted area D1. Incidentally, by changing the thickness of each of the coatings 62a to 62c to be applied in each step, or by changing the number of applications of the coating, the thickness of the coating applied to the restricted area D1 or the areas other than the restricted area D1 may be adjusted.

Thereafter, by curing the applied coatings 62a to 62c, the light diffusion portion 60 according to the modification is formed. Also in the modification, since it is possible to secure a clearance $h_1$ between the light diffusion portion 60 and the tab wiring 72 in the restricted area D1, the same effect as the above embodiment can be obtained. Further, in the modification, the light diffusion portion 60 is provided on the entire surface of the outer peripheral area C1, which can enhance the function of protecting the outer peripheral end of the solar cell element 70.

The thickness $d_1$ of the light diffusion portion 60 in the direction crossing the surface (light-receiving surface 70a) in the restricted areas D1 and D2 may be smaller than the thickness $d_0$ of the light diffusion portion 60 in the direction crossing the surface (light-receiving surface 70a) in the areas other than the restricted areas D1 and D2.

As a method for manufacturing the solar cell module 100, after applying the coating 62a in the outer peripheral area C1, the coatings 62b and 62c may be applied thereover in the outer peripheral area C1 except the restricted areas D1 and D2.

(Modification 2)

FIGS. 12A to 12C are top views illustrating printing plates 280 to be used for applying the coating to the light diffusion portion according to a modification. These figures each show a pattern 282 in a portion of the printing plate 280, which corresponds to the restricted area D1 provided on the left side 74a. In the above-described embodiment, it was decided to use the printing plate 80 having the pattern 82 in which no opening is provided at a position corresponding to the restricted area D1; however, in the modification, the printing plate 80 having a pattern 282 in which partial openings 282e are provided at a position corresponding to the restricted area D1 is used. That is, the printing plate 280 according to the modification has the pattern 282 in which the aperture ratio of the portion corresponding to the restricted area D1 is smaller than the aperture ratio of the portion corresponding to the outer peripheral area other than the restricted area D1. By using the printing plate 280 like this, the application amount of the coating applied to the restricted area D1 is reduced in order to reduce the thickness of the light diffusion portion 60 provided in the restricted area D1. Also, the light diffusion portion 60 can be formed while avoiding a part of the restricted area D1 and the space where the light diffusion portion 60 is provided is restricted within the restricted area D1.

FIG. 12A illustrates the printing plate 280 having the partial openings 282e in a rectangle shape and allowing the coating to be applied in a striped pattern in the restricted area D1. FIG. 12B illustrates the printing plate 280 having the partial openings 282e in a circular shape and allowing the coating to be applied in a polka-dotted pattern in the restricted area D1. FIG. 12C illustrates the printing plate 280 having the partial openings 282e in a hexagonal shape and allowing the coating to be applied in a honeycomb pattern in the restricted area D1. In this manner, by using the printing plate 280 having a small aperture ratio for the restricted area D1, the coating to be applied to the restricted area D1 is reduced as compared with the areas other than the restricted area D1. This can restrict the thickness and formed area of the light diffusion portion 60 formed in the restricted area D1, reducing the contact between the light diffusion portion 60 and the tab wiring 72.

The light diffusion portion 60 may be provided in the restricted areas D1 and D2 while avoiding a part of the restricted areas D1 and D2.

According to a method for manufacturing the solar cell module 100, the coating 62 may be applied to the outer peripheral area C1 by using the printing plate 280 having a pattern corresponding to the outer peripheral area C1, on which the aperture ratio of a portion corresponding to the restricted areas D1 and D2 are smaller than the aperture ratio of a portion corresponding to the outer peripheral area C1 except the restricted areas D1 and D2.

(Modification 3)

Figure 13:
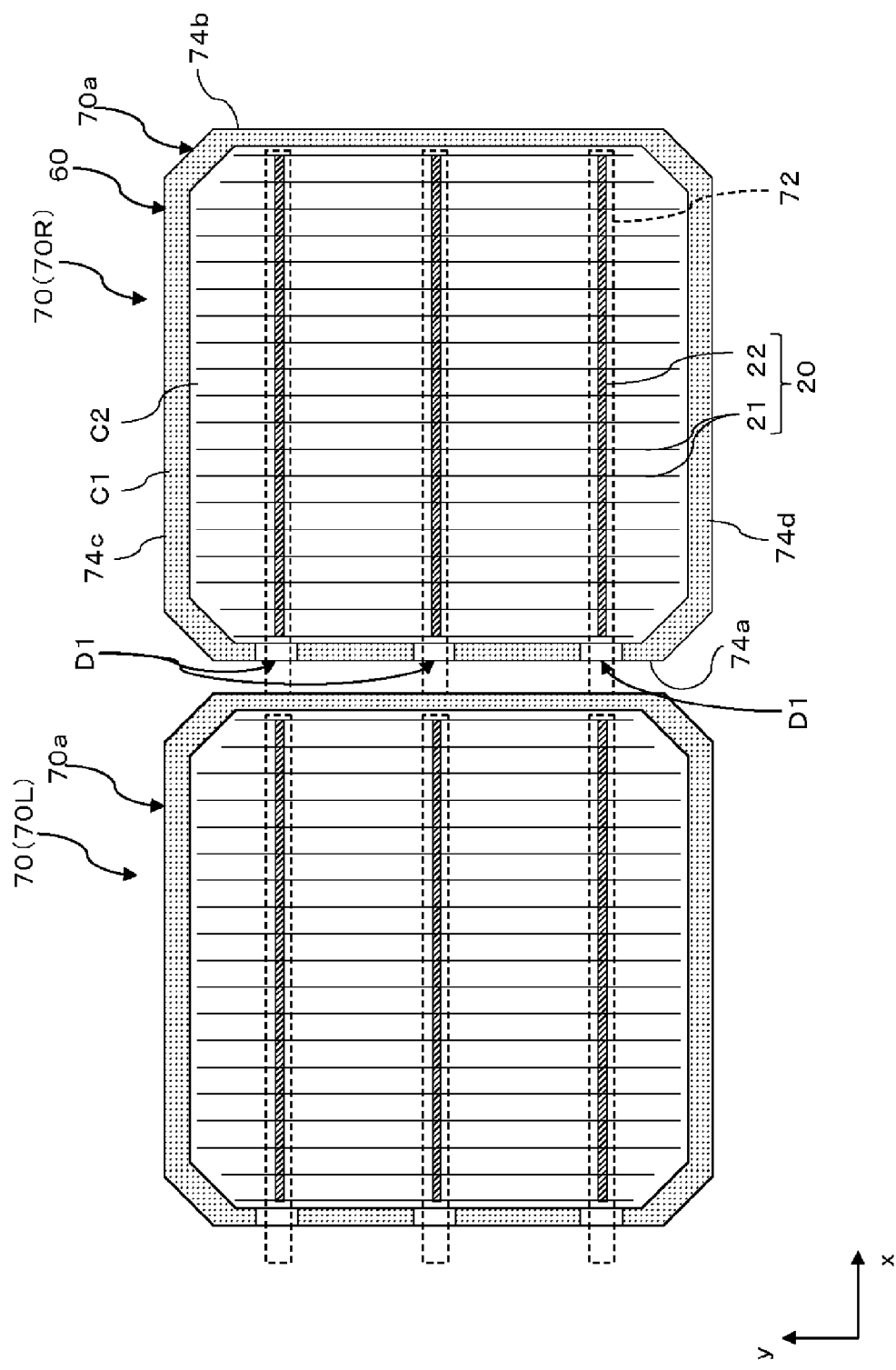
FIG. 13 is a top view illustrating restricted areas of a solar cell element according to a modification.

FIG. 13 is a top view illustrating the restricted area D1 of the solar cell element 70 according to a modification. In the above embodiment, the second restricted area D2 is provided to the right side 74b where the tab wiring 72 does not intersect the outer peripheral area C1 of the light-receiving surface 70a. In this modification, the restricted area D1 is provided only to the left side 74a where the tab wiring 72 intersects the outer peripheral area C1, and no restricted area is provided to the right side 74b where the tab wiring 72 does not intersect the outer peripheral area C1. Accordingly, in this modification, the light diffusion portion 60 is provided on the entire surface of the area along the right side 74b in the outer peripheral area C1. Hence, the light is further effectively utilized as compared with the case where a part of the right side 74b is not provided with the light diffusion portion 60.

Incidentally, in the modification, the restricted area D1 may not be provided with the light diffusion portion 60 or may be provided with the light diffusion portion 60 thinner than in other areas. In addition, the light diffusion portion 60 may be provided within the restricted area D1 while avoiding a part of the restricted area D1, and a striped pattern, polka-dotted pattern or honeycomb pattern may be employed as the shape of the light diffusion portion 60.

Although the present invent ion has been described with reference to the above-described embodiments, the present invention is not intended to be limited to the above embodiments, and appropriate combinations and replacements of configurations of the embodiments are also intended to be included in the present invention. It is also possible to rearrange appropriately a combination or the order of processing in each embodiment based on the knowledge of a person skilled in the art or to add modifications of various design changes and the like to the respective embodiments, and embodiments to which such modifications are added also can be included in the scope of the present invention.

In the above embodiment, although the case of using the screen printing as a method for applying the coating for printing is described, other printing methods may be used. For example, an offset printing method may be used in which a coating embedded in recesses of a printing plate is transferred to a cylindrical blanket and the coating having been transferred to the blanket is applied to the light-receiving surface 70*a*. Other than this, the coating may be applied by a pad printing method or a known technique such as letterpress printing or intaglio printing.

In the solar cell element 70 shown in the embodiment described above, it is assumed that a p-type amorphous layer is provided on the light-receiving surface 70*a* side of the semiconductor substrate, and an n-type amorphous layer is provided on the back surface 70*b* side; however, a solar cell element having the conductivity types disposed oppositely may also be used. Further, the semiconductor substrate may be a p-type single-crystal silicon substrate.

It should be understood that the invention is not limited to the above-described embodiment, but may be modified into various forms on the basis of the spirit of the invention. Additionally, the modifications are included in the scope of the invention.

What is claimed is:

1. A solar cell module comprising:
a plurality of solar cell elements, coupled to each other by a connection member, each of the plurality of solar cell elements including:
a surface comprising an inner area facing a side on which light is incident and an outer peripheral area facing the side on which light is incident and surrounding the inner area, with the connection member running on the surface; and
a light diffusion portion provided on the outer peripheral area of the surface, wherein the light diffusion portion is not provided on the inner area of the surface,
wherein the outer peripheral area of the surface has a non-restricted area on which the light diffusion portion is formed and a restricted area on which formation of the light diffusion portion is restricted,
the restricted area is provided at an intersection of the outer peripheral area and the connection member, and
the non-restricted area alternates with the restricted area in a direction along an outer periphery of the solar cell element.

2. The solar cell module according to claim 1, wherein each of the plurality of solar cell elements has a bus bar electrode extending along the connection member on the surface, and wherein
the restricted area is provided near an end of the bus bar electrode.

3. The solar cell module according to claim 1, wherein a thickness of the light diffusion portion in the restricted area is less than a thickness of the light diffusion portion in the non-restricted area.

4. The solar cell module according to claim 1, wherein the light diffusion portion is provided in the restricted area while avoiding a part of the restricted area.

5. The solar cell module according to claim 3, wherein the light diffusion portion is provided in the restricted area while avoiding a part of the restricted area.

6. The solar cell module according to claim 1, wherein the non-restricted area is provided at a different location than the intersection.

7. The solar cell module according to claim 1, wherein the connection member includes first and second connection members running on the surface of at least one of the plurality of solar cell elements,
the restricted area is provided both at a first intersection of the outer peripheral area and the first connection member and at a second intersection of the outer peripheral area and the second connection member, and
the non-restricted area is provided between the first and second intersections.

* * * * *